(12) United States Patent
Sethi et al.

(10) Patent No.: US 9,978,896 B2
(45) Date of Patent: May 22, 2018

(54) ENCAPSULANT BONDING METHODS FOR PHOTOVOLTAIC MODULE MANUFACTURING

(71) Applicant: SUNPOWER CORPORATION, San Jose, CA (US)

(72) Inventors: Sunny Sethi, San Bruno, CA (US); David Okawa, San Bruno, CA (US)

(73) Assignee: SunPower Corporation, San Jose, CA (US)

( * ) Notice: Subject to any disclaimer, the term of this patent is extended or adjusted under 35 U.S.C. 154(b) by 0 days. days.

(21) Appl. No.: 14/855,097

(22) Filed: Sep. 15, 2015

(65) Prior Publication Data

US 2017/0077332 A1    Mar. 16, 2017

(51) Int. Cl.
    *H01L 31/048* (2014.01)

(52) U.S. Cl.
    CPC ........ *H01L 31/048* (2013.01); *H01L 31/0481* (2013.01); *Y02E 10/50* (2013.01)

(58) Field of Classification Search
    CPC . H01L 31/046; H01L 31/048; H01L 31/0481; B29C 65/32; B29C 65/7855; B29C 65/18; B29C 65/38; B29C 66/91651; B32B 37/06; B32B 2310/0812; Y10T 156/1089; Y10T 156/109; Y10T 156/1092; Y10T 156/1093
    USPC ....... 438/57; 156/272.2–275.7; 291/601, 633
    See application file for complete search history.

(56) References Cited

U.S. PATENT DOCUMENTS

| | | | | |
|---|---|---|---|---|
| 4,154,998 A | * | 5/1979 | Luft | H01L 31/048 136/244 |
| 8,796,061 B2 | * | 8/2014 | Bunea | H01L 31/048 257/E31.001 |
| 2008/0276983 A1 | | 11/2008 | Drake et al. | |
| 2009/0011535 A1 | | 1/2009 | Lindstrom | |
| 2010/0139740 A1 | * | 6/2010 | Xavier | H01L 31/048 136/251 |
| 2011/0062148 A1 | | 3/2011 | Kumaria et al. | |

(Continued)

FOREIGN PATENT DOCUMENTS

| | | | | |
|---|---|---|---|---|
| JP | 2014060209 | | 4/2014 | |
| WO | WO-2012103551 | | 8/2012 | |
| WO | WO 2013011194 A1 | * | 1/2013 | B32B 37/12 |

OTHER PUBLICATIONS

Sethi et al., U.S. Appl. No. 14/318,469 entitled "Encapsulants for Photovoltaic Modules" filed Jun. 27, 2014, 27 pgs.

(Continued)

*Primary Examiner* — John Goff
(74) *Attorney, Agent, or Firm* — Schwabe, Williamson & Wyatt, P.C.

(57) ABSTRACT

Various improved approaches to prevent solar cell motion during manufacturing of PV laminates and modules are described herein. Disclosed contactless heating methods comprise positioning a plurality of solar cells on a layer of encapsulant and heating an encapsulant bonding region within the first encapsulant layer to a temperature sufficient to adhere the plurality of solar cells to the superstrate. Compared to some heat-tacking methods and manual taping, the contactless heating methods described herein provide an accurate, high-throughput approach to inhibiting solar cell shifting during PV module manufacture.

8 Claims, 8 Drawing Sheets

(56) References Cited

U.S. PATENT DOCUMENTS

| | | | | |
|---|---|---|---|---|
| 2012/0279647 A1* | 11/2012 | Staiger | ............... | B29C 65/3644 |
| | | | | 156/272.2 |
| 2012/0298172 A1* | 11/2012 | Baert | ................... | H01L 31/048 |
| | | | | 136/244 |
| 2013/0037084 A1* | 2/2013 | Chidambaram | .... | H01L 31/0481 |
| | | | | 136/247 |
| 2013/0164466 A1* | 6/2013 | Khadilkar | ................ | C09D 5/34 |
| | | | | 428/34.5 |
| 2014/0034117 A1* | 2/2014 | Wiesenfarth | ......... | H01L 31/048 |
| | | | | 136/255 |

OTHER PUBLICATIONS

International Search Report and Written Opinion for PCT Patent Application No. PCT/US16/45212 dated Nov. 18, 2016, 14 pgs.
International Preliminary Report on Patentability from PCT/US2016/045212, dated Mar. 20, 2018, 10 pgs.

* cited by examiner

ENCAPSULANT BONDING METHODS FOR PHOTOVOLTAIC MODULE MANUFACTURING

BACKGROUND

Photovoltaic (PV) cells, commonly known as solar cells, are well known devices for conversion of solar radiation into electrical energy. Generally, solar radiation impinging on the surface of, and entering into, the substrate of a solar cell creates electron and hole pairs in the bulk of the substrate. The electron and hole pairs migrate to p-doped and n-doped regions in the substrate, thereby creating a voltage differential between the doped regions. The doped regions are connected to the conductive regions on the solar cell to direct an electrical current from the cell to an external circuit. Solar cells can be combined in a solar cell string. Solar cell strings can be combined with encapsulants to form an array such as a PV module. The electrical energy collected from all of the solar cells can be combined in series and parallel arrangements to provide power with a certain voltage and current.

Encapsulants can provide electrical insulation, reduce moisture ingress, and couple a substantially transparent cover (e.g. glass) to the PV cells. Encapsulants can also protect components of the PV module from mechanical stress and corrosion. Improved approaches to manufacturing of PV modules with encapsulants are generally desirable.

BRIEF DESCRIPTION OF THE DRAWINGS

The following drawings illustrate by way of example and not limitation. For the sake of brevity and clarity, every feature of a given structure is not always labeled in every figure in which that structure appears. Identical reference numbers do not necessarily indicate an identical structure. Rather, the same reference number may be used to indicate a similar feature or a feature with similar functionality, as may non-identical reference numbers. The figures are not drawn to scale.

DETAILED DESCRIPTION

Figure 1:
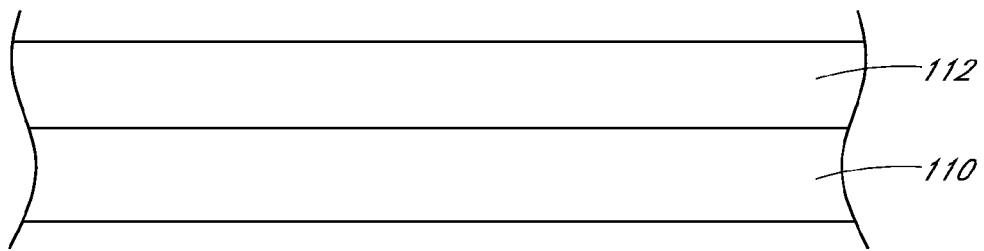
FIG. 1 illustrates a cross-sectional view of a PV laminate at a stage in a PV module manufacturing process, according to some embodiments.

The following detailed description is merely illustrative in nature and is not intended to limit the embodiments of the subject matter of the application or uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Terminology—The following paragraphs provide definitions and/or context for terms found in this disclosure (including the appended claims):

This specification includes references to "one embodiment" or "an embodiment." The appearances of the phrases "in one embodiment" or "in an embodiment" do not necessarily refer to the same embodiment. Particular features, structures, or characteristics can be combined in any suitable manner consistent with this disclosure.

This term "comprising" is open-ended. As used in the appended claims, this term does not foreclose additional structure or steps.

Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

As used herein, the terms "first," "second," etc. are used as labels for nouns that they precede, and do not imply any type of ordering (e.g., spatial, temporal, logical, etc.). For example, reference to a "first" encapsulant layer does not necessarily imply that this encapsulant layer is the first encapsulant layer in a sequence; instead the term "first" is used to differentiate this encapsulant from another encapsulant (e.g., a "second" encapsulant).

The terms "a" and "an" are defined as one or more unless this disclosure explicitly requires otherwise.

The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

As used herein, "inhibit" is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

As used herein, the term "substantially" is defined as largely but not necessarily wholly what is specified (and includes what is specified; e.g., substantially 90 degrees includes 90 degrees and substantially parallel includes parallel), as understood by a person of ordinary skill in the art. In any disclosed embodiment, the terms "substantially," "approximately," and "about" may be substituted with "within [a percentage] of" what is specified, where the percentage includes 0.1, 1, 5, and 10 percent.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

As used herein, "regions" can be used to describe discrete areas, volumes, divisions or locations of an object or material having definable characteristics but not always fixed boundaries. In an example, encapsulant bonding regions can describe a plurality of encapsulant locations within a larger encapsulant layer, wherein the encapsulant bonding regions may be characterized as having an adhesive stick, or tack. An adhesive stick, or tack, describes a surface property of a material enabling bond formation when two surfaces are brought into contact.

As used herein, the term "liquid" defines a phase of matter in which atoms or molecules can flow, or move freely while remaining in contact with one another. A "liquid" may be characterized by the ability to conform to the shape of a container in which it is held.

The term "gel" is used herein to define a dispersion of molecules of a liquid within a solid, wherein the solid is a continuous phase and the liquid is a discontinuous phase. A "gel" may be characterized as exhibiting no flow when in a steady-state. For example, a gel described herein may comprise a liquid within a cross-linked solid polymer network.

In the following description, numerous specific details are set forth, such as specific operations, in order to provide a thorough understanding of embodiments of the present disclosure. It will be apparent to one skilled in the art that embodiments of the present disclosure may be practiced without these specific details. In other instances, well-known techniques are not described in detail in order to not unnecessarily obscure embodiments of the present invention. The feature or features of one embodiment can be applied to other embodiments, even though not described or illustrated, unless expressly prohibited by this disclosure or the nature of the embodiments.

Manufacturing multi-layered photovoltaic (PV) laminates and/or modules often involves a series of steps to lay and process individual layers. During transfer between different processing stations, solar cell strings can move or shift during different manufacturing steps, e.g., lamination. In some heat tacking techniques used in PV module manufacturing, a heating head is pressed on a portion of a cell string in contact with an encapsulant. The heating head is moved down towards the cell string using motion actuators to compress a portion of the cell string with a positive pressure (for example, at interconnect or metal bus bar regions). The downward force and temperature allows the encapsulant to melt and adhere to the cell string. Some heat tacking methods are limited in that the positive pressure applied by the heating head results in the encapsulant flowing or squeezing out from under the heating head resulting in poor adhesion and/or non-uniform encapsulant layers. Some heat-tacking methods create performance and reliability issues for both solid and liquid encapsulants, however for liquid encapsulants, the issue is more severe. Furthermore, due to poor thermal contact between the heat tacking head and the cell string, longer manufacturing times can be necessary for effective heat tacking.

Various improved approaches to prevent solar cell motion during manufacturing of PV laminates and modules are described herein. They can be characterized as "contactless," "non-contact" or "minimal contact" heating or heat-tacking methods which locally heat an encapsulant and/or solar cell string to produce encapsulant bonding regions therebetween. The terms "contactless," "non-contact" or "minimal contact" refer to the characteristics of the heating mechanism (e.g., induction heating, laser heating, or heated air flow as described in more detail below) as opposed to such heating heads employing a positive pressure on the encapsulant (e.g., approximately above 50 kPa). In an embodiment, the terms "contactless heating," "non-contact heating" and/or "minimal contact heating" can refer to an encapsulant heating process in which no physical contact is necessary. Compared to some heat-tacking methods and/or manual taping, the methods described herein provide an accurate, high-throughput approach to inhibiting solar cell shifting during PV module manufacture, thereby lowering manufacturing costs and increasing yield while improving quality and performance.

Figure 2:
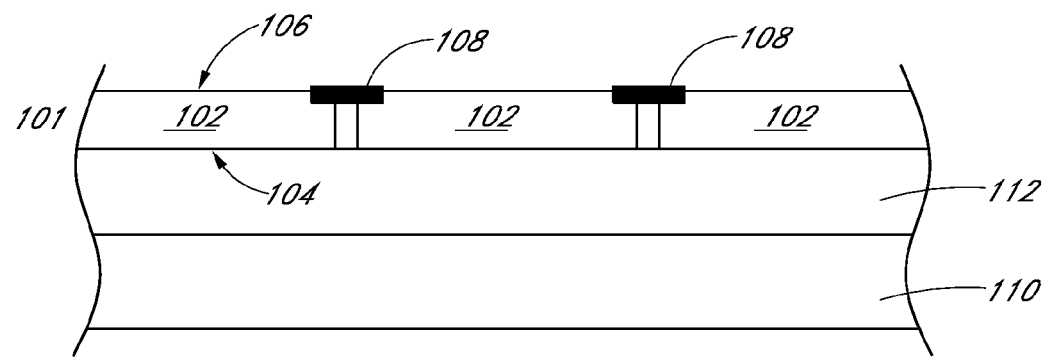
FIG. 2 illustrates a cross-sectional view of a PV laminate at a stage in a PV module manufacturing process, according to some embodiments.
Figure 3:
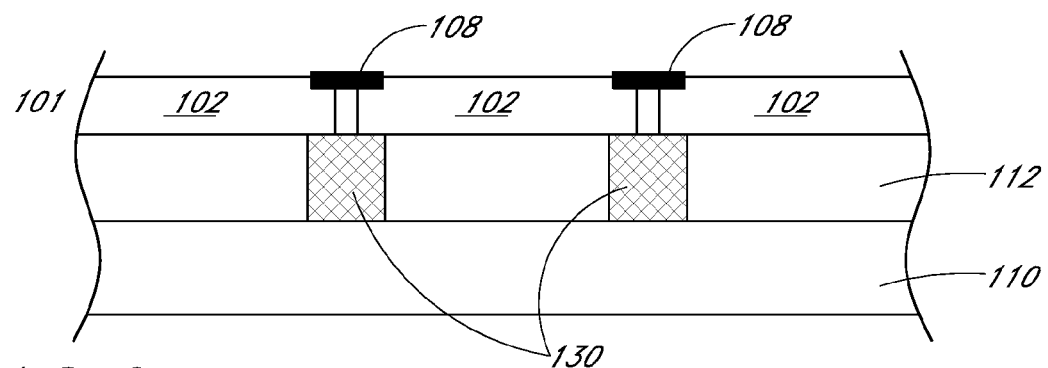
FIG. 3 illustrates a cross-sectional view of a PV laminate at a stage in a PV module manufacturing process, according to some embodiments.

FIG. 1-3 illustrate cross-sectional views of various stages in a PV laminate manufacturing process in accordance with an embodiment of the present disclosure. In the following figures, the same reference number may be used to indicate a similar feature or a feature with similar functionality but this does not necessarily indicate an identical structure.

Referring to FIG. 1, which depicts an initial stage in PV laminate manufacture, a first layer of encapsulant 112 is provided (e.g. dispensed, deposited, formed, pasted, coextruded, coated etc.) on a superstrate 110. The superstrate 110 can comprise a substantially transparent cover made of glass or other substantially transparent material. The term "substantially transparent" is used herein to mean transmission of light through the region of material can be greater than 80% for light in the ranges of 200-1200 nm. In certain embodiments, the material chosen for construction of the superstrate, or transparent top cover, can be selected for properties which minimize reflection, thereby permitting the maximum amount of sunlight to pass therethrough. In an embodiment, the superstrate comprises an anti-reflective coating (ARC). Additionally, the superstrate can be selected to provide structural rigidity to the PV module.

In an embodiment, a liquid state encapsulant can be formed, or coated, on the superstrate 110 in a substantially uniform manner in a thickness range of 50-500 microns. As one example, a substantially uniform thickness of 50 microns does not necessarily mean that the thickness of the encapsulant is 50 microns across the full surface area of the encapsulant. As another example, a substantially uniform thickness of 50 microns could include minor variations within some tolerance range. For example, tolerance range could be +/−5 microns.

In some embodiments, the encapsulant material can be a polymer of any molecular weight that can undergo liquid to solid transition during PV module manufacture. In some embodiments, the encapsulant material can be selected based on its glass transition temperature, viscosity and/or other properties. In an embodiment, a liquid phase encapsulant can coat, cover and/or or embed a solar cell. In a liquid state, the encapsulant can have a viscosity in the range of 15,000 - 100,000 cP. Also in a liquid state, the encapsulant can have self-leveling properties, e.g. the first encapsulant 112 can flow to form a substantially uniform film, for example, under the effect of gravity, centrifugal forces, and/or forces related to encapsulant properties such as surface-tension, hydrophobicity, hydrophilicity and so on. In one embodiment, encapsulant can have a pot-life of greater than 1 hour after forming or dispensing.

In one embodiment, the encapsulant material can comprise siloxane functional groups, which can be cured to form an organopolysiloxane comprising siloxane units. For example, the encapsulant can be a silicone polymer such as polydimethylsiloxane (PDMS). As another example, the encapsulant material can comprise a modified polyolefin that protectively encapsulates solar cells. The polyolefin can have less than five weight percent of oxygen and nitrogen in the backbone or side chain. In other words, the combined weight percent of oxygen and nitrogen in any location in the molecular structure of the polyolefin is less than five. In some embodiments, the encapsulant can have a refractive index greater than 1.35. In an embodiment, the encapsulant can exhibit adhesion to glass, silicon or metals (e.g. aluminum or copper) of greater than 10 N/cm.

Referring to FIG. 2, a plurality of solar cells 102 are positioned on the first layer of encapsulant 112. Each solar cell 102 can have a front side 104 that faces the sun during normal operation and a backside 106 opposite the front side 104. In the example of FIG. 2, the front sides 104 are placed on the first layer of encapsulant 112, however in other embodiments, the backsides 106 can be placed on the encapsulant layer 112.

In some embodiments, the solar cells can be back contact solar cells with the front sides of the solar cells facing the sun to collect solar radiation during normal operation of the PV module. The back side of the solar cells can have electrical contacts and/or interconnects. In other embodiments, the solar cells can be front-contact solar cells having electrical contacts and/or interconnects on both front and back sides of the solar cell.

In an embodiment, electrical contacts and/or interconnects can be used to electrically couple the plurality of solar cells together to form a solar cell string. In the example of FIG. 2 depicting a stage in some PV laminate manufacturing processes subsequent to the stage depicted in FIG. 1, the solar cells 102 are electrically coupled together by interconnects 108 to form solar cell string 101. In the example of FIG. 2, three solar cells 102 are depicted for ease of description, however additional cells can be provided to form longer cell strings and/or two-dimensional solar cell arrays.

The positioning of the solar cells 102 relative to each other and the superstrate may be determined by the particular PV module application (e.g. stationary, mobile, etc.) and/or design considerations (e.g. rooftop, ground, vehicle, power plant, concentrated photovoltaic (CPV), and so on). In an embodiment, the plurality of solar cells can be positioned such that an edge of a first solar cell is parallel or substantially parallel to an edge of an adjacent solar cell. In another embodiment, the solar cells are in alignment such that the center point of a first solar cell and the center point of adjacent solar cell(s) are approximately in a straight line. It may be appreciated that accurate positioning of the solar cells is especially critical for concentrated photovoltaic systems (CPV) since the light is focused on a smaller area compared to one-sun systems; even a few millimeters of misalignment can be undesirable.

It can be desirable that the cells 106 and/or cell string 101 do not move or shift in subsequent manufacturing operations of the PV module e.g. lamination, transfer from one stage to another and so on. This may be especially critical in embodiments where the encapsulant 112 is provided in a liquid state as cell string 101 can shift easily due to the ability of the encapsulant to flow.

As will be described in more detail later, at least one encapsulant bonding region can be provided to limit movement or shifting of cells 106 and/or cell string 101. FIG. 3 depicts a stage in some PV laminate manufacturing processes subsequent to the stage depicted in FIG. 2. In FIG. 3, two encapsulant bonding regions 130 are depicted, however any suitable number of encapsulant bonding regions can be provided to fixedly position the solar cells 102 and or cell string 101. Using any selected technique, that at least one encapsulant bonding region is provided to secure the predetermined position of solar cell string 101 relative to the superstrate 110.

The encapsulant bonding regions can be provided in any suitable location or array of locations to secure, or restrict shifting of the solar cells from their predetermined position relative to each other and/or the superstrate. For example, the encapsulant bonding regions can be provided between two solar cells, at the edges of solar cells, at solar cell interconnects, bus bars or a combination thereof. It is only necessary that the encapsulant bonding regions reduce movement or shifting of cell string. In an embodiment, heat-tacking of the encapsulant can fix the spacing of the solar cells, even in later thermal processing steps, such as final curing of the core of the module in a laminator or oven reflow.

Figure 4:
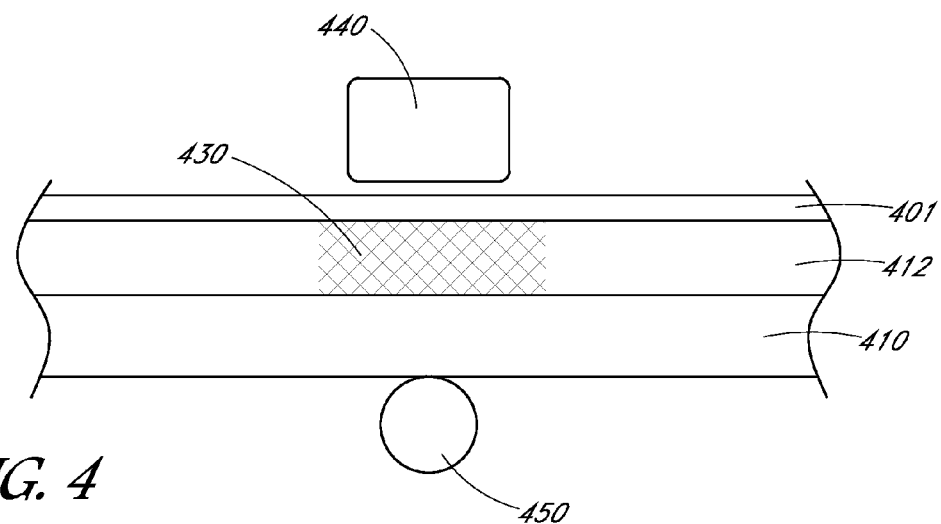
FIG. 4 illustrates a cross-sectional view of a contactless induction heating operation in a PV module manufacturing process, according to some embodiments.

Exemplary contactless heating operations will now be described. FIG. 4 depicts a cross-sectional view of a PV laminate subassembly during or subsequent to a contactless heating operation. In one embodiment, the contactless heating operation comprises positioning a contactless heating head proximate to the encapsulant layer. In the exemplary cross-sectional illustration of FIG. 4, encapsulant layer 412 is situated between superstrate 410 and cell string 401. In some embodiments, cell string 401 can rest above, or essentially float on encapsulant layer 412 as depicted in FIG. 4 for simplicity; however, in other embodiments, the cell string can be coated or embedded by the encapsulant such that the cell string is positioned within the encapsulant layer. As depicted FIG. 4, a contactless heating head 440 is placed in close proximity to the encapsulant bonding region 430. In some embodiments, a single contactless heating head 440 is positioned in proximity to a single encapsulant bonding region 430 as depicted in FIG. 4 during a heating event, however in other embodiments, an array of contactless heating heads can be positioned proximate to an array of associated encapsulant bonding regions during a heating event.

In one embodiment, a contactless, or non-contact, heating head can be positioned above the encapsulant layer in the absence of positive pressure. In other embodiments, a contactless, or minimally contacting, heating head can be employed to lightly press down on a portion of the cell string to a predetermined height relative to the encapsulant layer.

As a non-limiting example, a light pressure (e.g. approximately below 5 kPa) can be employed in some embodiments for situating, positioning or straightening the solar cells.

In an embodiment, the contactless heating head 440 is electrically conductive. For example, the contactless heating head 440 can comprise a metallic or semiconductor material such as steel, copper, aluminum, brass, carbon, graphite, silicon carbide etc. In one embodiment, the contactless heating head 440 does not comprise a resistive heating element. The contactless heating head 440 can be provided in any suitable size and shape depending on the desired characteristics of the encapsulant bonding region 430.

In an embodiment, the contactless heating head 440 is situated within inductive range of a magnetic field produced from an inductive heating circuit. In the example of FIG. 4, a contactless heating operation comprises heating the encapsulant bonding region 430 by producing a magnetic field from an inductive heating coil 450 situated below the superstrate 410. The inductive heating circuit can be positioned in any suitable position relative to the contactless heating head. Using any technique, the contactless heating head, or susceptor, is in inductive range of the induction heating circuit, or coil.

In an embodiment, induction heating coil 450 is operatively coupled to a power supply to deliver high frequency alternating current to the induction heating coil 450, thereby creating a magnetic field. Not to be bound by any particular theory, but the resulting magnetic field induces eddy currents within the contactless heating head 440. The friction from these currents can generate a heating event in the contactless heating head 440, with the heat being transferred to the encapsulant bonding region 430. In an embodiment, the heat is transferred via convective heating, radiative heating, or a combination thereof. In some embodiments, the heat can be transferred via thermal conduction, for example in embodiments where a contactless heating head is in physical contact with on a portion of the cell string.

The operating frequency of the induction circuit can depend on the size of the contactless heating head 440, the material properties of the contactless heating head 440, material properties of the encapsulant, the inductance of the inductive heating coil 450, the desired temperature to which the encapsulant region 430 is heated, the desired depth of penetration into the encapsulant region 430, the relative positioning of the contactless heating head 440 to the heating coil 450, or a combination thereof. In an embodiment, the larger the contactless heating head, the lower the frequency, and the smaller the contactless heating head, the higher the frequency. Among other examples, the inductive heating coil 450 can produce a magnetic field alternating at a frequency greater than 1 kHz.

The power of the induction heating circuit may depend on the mass of the contactless heating head 440, the material properties of the contactless heating head 440, the desired temperature to which the encapsulant bonding region 430 is heated, the extent of heat losses during the heating event, or a combination thereof. As a non-limiting example, an electrically conductive heating head 440 can be exposed to the magnetic field produced by the heating coil 450 at an average power density greater than 100 mW/cm$^2$.

In some embodiments, the contactless heating head 440 is exposed to the magnetic field in a single heating event. In other embodiments, the induction heating coil 450 produces the magnetic field intermittently resulting in heating pulses having time intervals, for example greater than 0.05 seconds.

Figure 5:
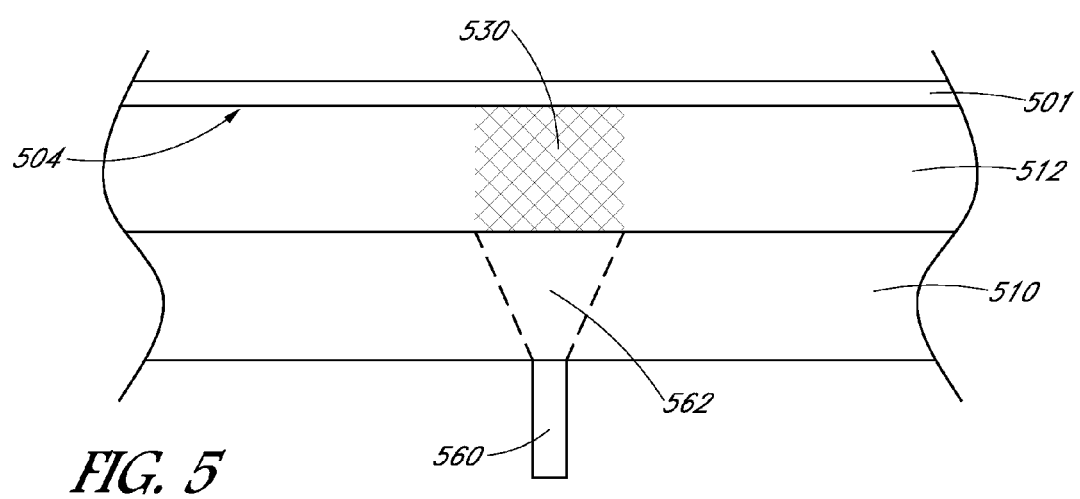
FIG. 5 illustrates a cross-sectional view of a contactless light-induced heating operation in a PV module manufacturing process, according to some embodiments.

In one embodiment, a contactless heating operation can comprise exposing an encapsulant bonding region to a light source or laser. In the illustrated example of FIG. 5, a light source 560 faces the front sides 504 of the solar cell string 501 and emits light of a first wavelength $\lambda_1$. The light beam 562 emitted by the light source 560 enters from and travels through a transparent superstrate 510 to shine on a region of the encapsulant layer 512, thereby heating the encapsulant bonding region 530. In an embodiment, the light beam 530 is focused on the encapsulant bonding region 530 and in effect, cures encapsulant within the encapsulant bonding region 530, thereby bonding or adhering the superstrate 510 to the cell string 501 via the encapsulant bonding region 530. In the example of FIG. 5, the light source 560 is positioned below the superstrate 510 and directly below the encapsulant bonding region 530, however in other embodiments, the light source can be positioned offset from the encapsulant bonding region and/or above the cell string or encapsulant. Using any selected technique, a light beam emitted from a light source can be directed toward an encapsulant bonding region. In some embodiments, a plurality of light sources can be employed. In some embodiments, a contactless heating head is placed above an encapsulant bonding region to reflect, direct, and/or focus the emitted light and/or heat towards the encapsulant bonding region.

In one embodiment, an encapsulant can comprise a light-curable encapsulant material. In one embodiment, the encapsulant is curable by exposure to ultraviolet (UV) light. The light source 560 can be actuated to emit electromagnetic radiation having a wavelength in the ultraviolet region. As a non-limiting example, the light source 560 can emit electromagnetic radiation having a wavelength of between approximately 200 nm to approximately 400 nm.

In one embodiment, the light source 560 can comprise different light sources or be provided as a single light source that is configurable to emit light of different wavelengths. For example, the encapsulant bonding region 530 can be cured to bond to the transparent superstrate 510 by exposure to light of a first wavelength $\lambda_1$, and the encapsulant bonding region 530 can be cured to bond to the cell string 501 by exposure to light of a second wavelength $\lambda_2$. In embodiments where a plurality of encapsulant layers are provided, each encapsulant layer can be cured by light of a different wavelength. For example, the encapsulant layers can be exposed to light of a first wavelength $\lambda_1$ to cure a first encapsulant layer then exposed to light of a second wavelength $\lambda_2$ to cure a second encapsulant layer. The order the encapsulant layers are cured can be varied depending on the particulars of the manufacturing process.

In an embodiment, an encapsulant comprises additives that allow it to bond to the superstrate upon curing. Similarly, an encapsulant can comprise additives that allow it to bond to the solar cells upon curing. For example, the additives can be activated by UV radiation, such that the encapsulant may be characterized as UV-curable.

In a manufacturing environment, the transparent superstrate 510 can be placed on a platform, such a workbench or conveyor, with a cutout to allow light to illuminate the superstrate 510 from underneath the platform. The encapsulant 512 is placed on top of the superstrate 510. The solar cell string 501 is thereafter accurately placed on the encapsulant layer 512 (e.g., using a robot). Once the superstrate 510, the encapsulant 512, and the solar cell string 501 are stacked, the light source 560 placed underneath the platform is actuated to produce the encapsulant bonding region 530.

Figure 6:
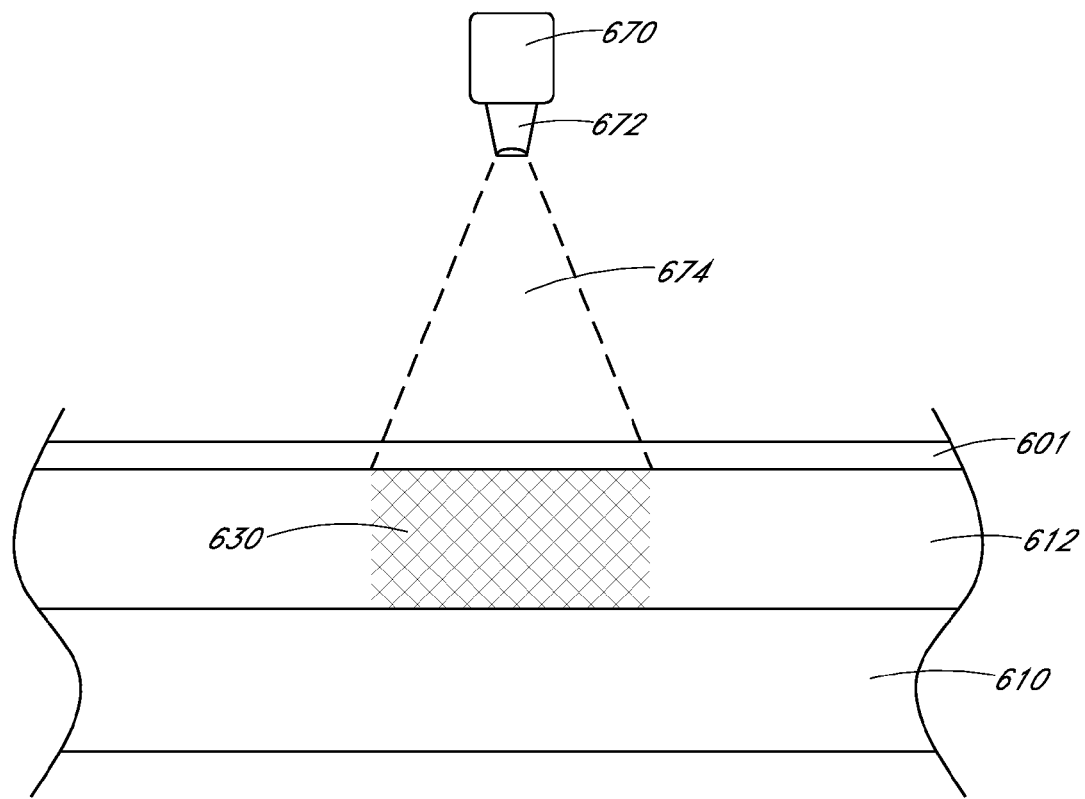
FIG. 6 illustrates a cross-sectional view of a contactless blower heating operation in a PV module manufacturing process, according to some embodiments.

In some embodiments, the contactless heating operation comprises directing a stream of heated fluid to impinge on the bonding region of the encapsulant layer. FIG. 6 depicts a cross-sectional view of a PV laminate subassembly during or subsequent to a contactless heating operation. In the example of FIG. 6, encapsulant layer 612 is situated between superstrate 610 and cell string 601. An air blower 670 positioned above the encapsulant bonding region 630 of the encapsulant layer 612. The blower 670 can heat ambient or compressed air and transport a heated air stream 774 to the encapsulant bonding region 630. The air can be heated to high temperature, for example up to 300° C., then directed to the encapsulant bonding region 630 through blower outlet, or nozzle 672. In the example illustrated in FIG. 6, the blower 670 is positioned directly above the encapsulant bonding region 630 of the encapsulant layer 612, however in other embodiments, the blower can be offset from the encapsulant bonding region, for example with a nozzle directed towards at an encapsulant bonding region. Using any selected technique, at least a portion of a heated fluid stream impinges on the encapsulant bonding region.

Figure 7C:
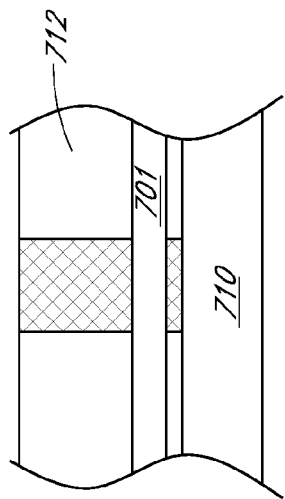
FIGS. 7A-7C illustrate cross-sectional views of different PV laminate configurations at a stage in a PV module manufacturing process, according to some embodiments.
Figure 7B:
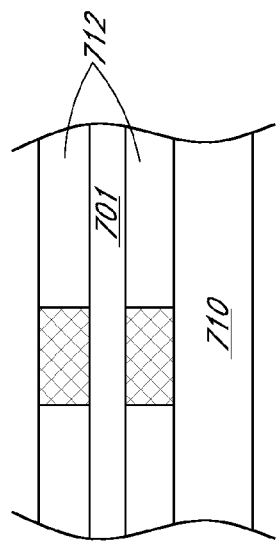
Figure 7A:
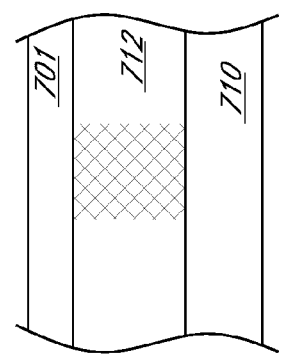

FIGS. 7A-7C depict various configurations of cell string 701 relative to a first encapsulant layer 712. In the exemplary cross-sectional illustration of FIG. 7(a), encapsulant layer 712 is provided between superstrate 710 and cell string 801. In the embodiment of FIG. 7(a), cell string 701 rests above, or essentially floats on encapsulant layer 712. In another embodiment illustrated in FIG. 7(b), solar cell string 701 is embedded in or coated by encapsulant of encapsulant layer 712 such that the cell string 701 is positioned entirely within encapsulant layer 712. In the illustrated embodiment of FIG. 7(b), cell string 701 is generally depicted at the center of encapsulant layer 712; however in other embodiments, the cell string 701 can be toward the top or towards the bottom of encapsulant layer 712. In the illustrated embodiment of FIG. 7(c), cell string 701 is located at the bottom of encapsulant layer 712 and above superstrate 710. In such an embodiment, cell string 701 can be partially or fully in physical contact with superstrate 710. In some embodiments, a thin layer of encapsulant can be present between cell string 701, the thin encapsulant layer being present continuously or discontinuously.

Figure 8:
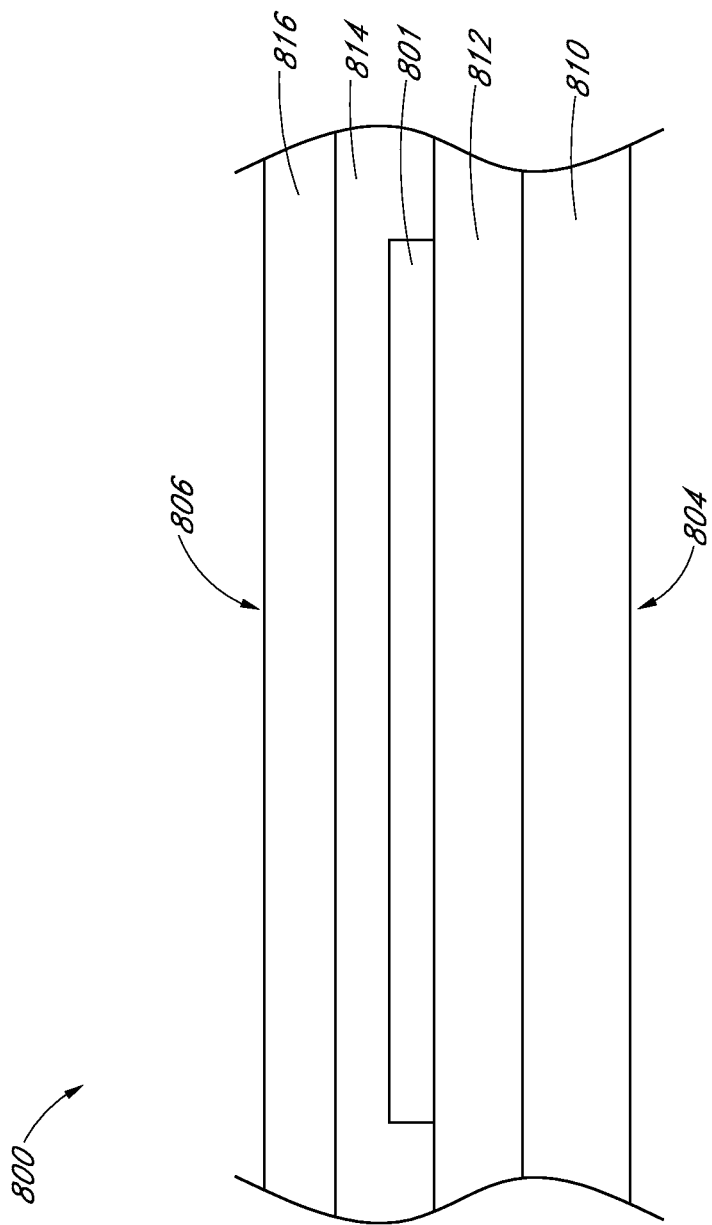
FIG. 8 illustrates a cross-sectional view of a PV laminate comprising two encapsulant layers at a stage in a PV module manufacturing process, according to some embodiments.

Referring to FIG. 8, a PV laminate 800 is a multi-layered structure comprising a solar cell string 801 embedded in an encapsulant or a plurality of encapsulant layers. In the example of FIG. 8, the PV laminate 800 comprises a first encapsulant layer 812 and second encapsulant layer 814, however in other embodiments a single encapsulant layer or more than two encapsulant layers can be provided. The PV laminate 800 further comprises a superstrate 810 and a backsheet 816. In an embodiment, the front side 804 of the PV laminate 800 faces the sun to collect solar radiation during normal operation of the PV laminate 800.

The PV module 800 can be a terrestrial solar cell module in that it is designed for use in applications, such as on rooftops or by photovoltaic power plants. In some embodiments, the PV module can be an element of a concentrated photovoltaic (CPV) system. CPV systems are those that use a series of optical elements like mirrors and/or lenses to focus a light beam on the solar cell string.

In various embodiments, the second encapsulant 814 can be formed from a liquid encapsulant or a flexible encapsulant. In an embodiment, the first and second encapsulants 812, 814 can be made of the same material or are made of different materials. In one embodiment, the second encapsulant 814 has a thickness greater than the first encapsulant 812. In an embodiment, the second encapsulant 814 can be made of a silicone polymer (e.g. similar to the first encapsulant 812). In some embodiments, the second encapsulant 814 can include a single or a combination of thermally conductive particles including, but not limited to, aluminum oxide, boron nitride and/or various ceramic particles used to increase the thermal conductivity of the second, or back, encapsulant. Improved heat transfer from the back side of the solar cells can enhance performance and extend life of the solar cells, especially in CPV applications. As an example, the thickness of the second encapsulant 814 can be in the range of 0.1-1.0 mm and/or can be greater than the thickness of the first encapsulant 812. As another example, the thickness of the second encapsulant 814 is approximately 0.25 mm.

In an embodiment, the second encapsulant 814 can include fillers for enhancing reflectivity (e.g. reflective fillers which reflect visible light wavelengths back into the solar cell). In some embodiments, the reflective fillers can include titanium oxide, calcium carbonate, and various white pigments composed of organic or inorganic materials. In an embodiment, the second encapsulant 814 can be colored white or substantially transparent. In one embodiment, fluorescent dyes can be added to the second encapsulant 814. These dyes can absorb radiation in the ultraviolet spectrum and emit light in the visible spectrum. In an embodiment, the second encapsulant 812 can be a flexible encapsulant (e.g., an ethylene-vinyl acetate (EVA) encapsulant, ionomer, polyvinylbutyryl (PVB) or poly olefin (PO) encapsulant).

In an embodiment, the PV module 800 comprises a multilayer encapsulant. In the example of FIG. 8, only two encapsulant layers are shown, however any suitable number of encapsulant layers can be provided. Furthermore, the thicknesses of the encapsulant layers can vary depending on the particulars of the implementation. The encapsulant layers of the PV module can be selected to provide structural support and protection of solar cells while ensuring a maximum amount of visible light transmission to the solar cells. Furthermore, the encapsulant and method of implementation can enable accurate and secure positioning of embedded solar cells within a PV module.

As depicted in FIG. 8, a backsheet 816 can be provided as an electrically insulating region which protects the underside of the PV laminate 800. For example, the backsheet 816 can comprise a polymer sheet and/or be composed of glass. Additionally, the backsheet 816 can be colored or substantially transparent. In an embodiment, the second encapsulant 818 can be provided to allow for efficient heat transfer between a cell string 801 and a backsheet 816 via additive chemistry and/or geometry (e.g. thickness). In an embodiment, the backsheet 816 can also be a substantially transparent cover, e.g., for bifacial PV applications where light can be received from both the back side 806 and front side 804 of the PV laminate 800. In an embodiment, the backsheet 816 can be a metallic backsheet enhanced to facilitate a thermal pathway for the PV module 800. The backsheet 816 can comprise a single layer or multiple layers of materials that provide environmental protection to other components of the solar cell module. The backsheet 816 can comprise, for example, a flouropolymer, polyvinylidene fluoride, polytetrafluoroethylene, polypropylene, polyphenylene sulfide, polyester, polycarbonate, or polyphenylene oxide.

Figure 9:
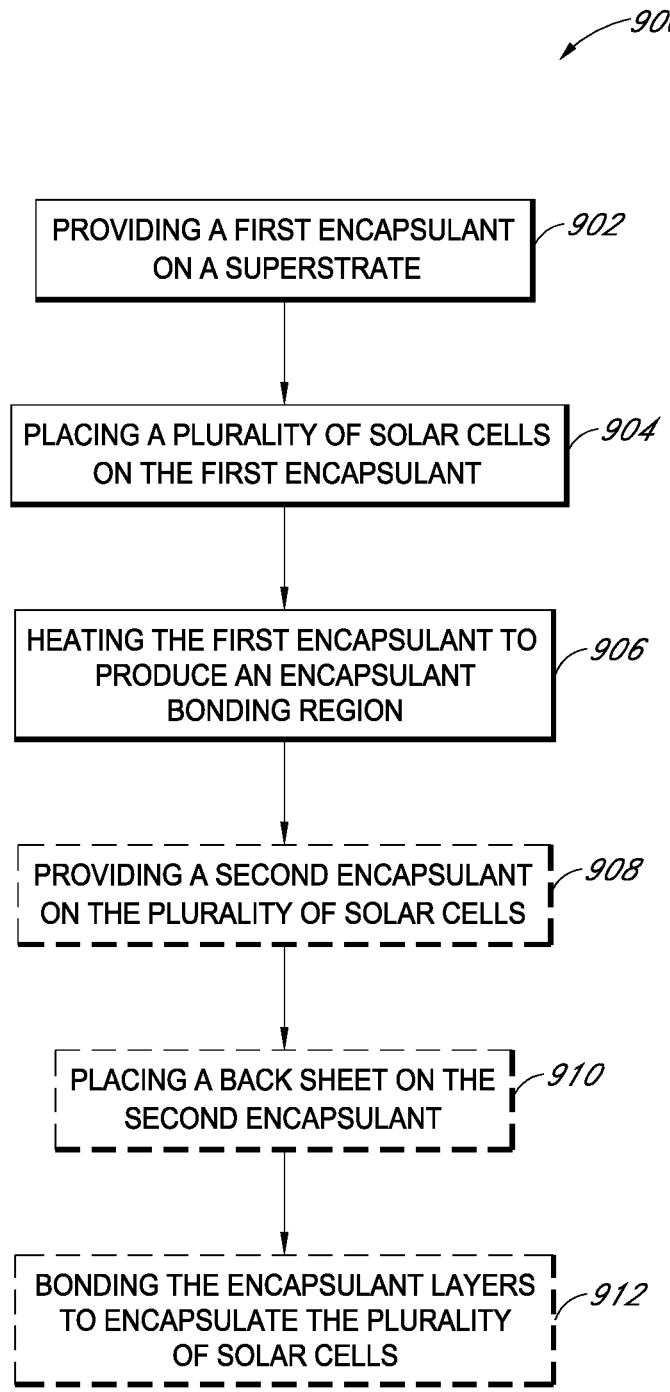
FIG. 9 illustrates a flowchart representation of a method for manufacturing a PV module, according to some embodiments.

FIG. 9 is a flowchart listing operations in a method of manufacturing a PV module, in accordance with an embodiment of the present disclosure. In various embodiments, the method of FIG. 9 can include additional or fewer blocks than illustrated.

Referring to operation 902 of flowchart 900, a first layer of encapsulant is provided (e.g. dispensed, deposited, formed, pasted, coextruded, coated etc.) on a superstrate. In one embodiment, providing the first encapsulant can comprise initially dispensing a plurality of encapsulant regions, particles or lines (e.g. silicone particles, discontinuous or continuous lines of encapsulant, etc.) onto the superstrate followed by spreading the dispensed encapsulant on the superstrate with an edge of an applicator. In some embodiments, the encapsulant can be formed and/or dispensed in a first direction on the superstrate. The applicator can then be applied in a second direction on the dispensed encapsulant, where the second direction is transverse (e.g., perpendicular, 70 degrees offset, etc.) to the first direction of dispensed encapsulant. For example, if the dispensed encapsulant is applied in the direction corresponding to the shortest dimension of the superstrate, the applicator can be applied transverse to that direction (e.g., the applicator can be applied in a direction corresponding to the longest dimension of the superstrate). In an embodiment, applying the applicator in such a manner allows for substantially uniform spreading of the dispensed encapsulant. In one embodiment, gravity can be used in addition to, or instead of the applicator, to substantially uniformly spread the encapsulant. The spread encapsulant can have a thickness of approximately 50-500 microns.

During processing, a plurality of solar cells can be placed on the first layer of encapsulant operation as in operation 904 of flowchart 900. During operation 904, the solar cells are placed in a predetermined position relative to the superstrate. Once the cells are positioned in step 904 of flowchart 900, it is desirable that the cells and/or cell string do not move or shift in subsequent manufacturing operations of the PV module, especially when the encapsulant is provided in a liquid state.

Referring to FIG. 9 and operation 906 of flowchart 900, at least one region of the first encapsulant layer can be heated to a temperature sufficient to produce at least one encapsulant bonding region. According to an embodiment, the heating operation 906 is a "contactless," "non-contact" or "minimal contact" heat-tacking step that locally heats the encapsulant to produce an encapsulant bonding region. In some embodiments, the encapsulant can be indirectly heated, e.g. via the solar cell string. As a non-limiting example, the heating temperature can be greater than 75° C.

In one embodiment, the contactless heating operation 906 initiates polymeric crosslinking of encapsulant functional groups within the encapsulant bonding region to produce a gel, semi-solid or solid having an adhesive stick, or tack. As such, the contactless heating operation 906 can be referred to as a "contactless heat-tacking" step. In an embodiment, a curing or a cross-linking process at step 906 changes the encapsulant within the encapsulant bonding region from a liquid state to a gel, semi-solid or solid state. As a non-limiting example, encapsulant cross-linking (e.g. liquid-to-solid transition) can initiate in a temperature range between 75-200° C. In an embodiment, the cross-linking can provide mechanical stability. In an embodiment, the encapsulant can inhibit cross-linking up to temperatures of 70° C. In a solid state, the encapsulant can provide structural support to the cell string and/or PV laminate such can be partially or fully rigid.

The contactless heating operation 906 can result in partial or full curing of the encapsulant within the encapsulant bonding region. In some embodiments, the heating process can transition the encapsulant from a liquid or a dilute gel to a less dilute gel (e.g. less liquid phase), semi-solid or a solid. Not to be bound by any particular theory, the contactless heating operation 906 can result in polymer crosslinking, toughening, hardening, liquid phase evaporation, or a combination thereof. For example, the contactless heating operation 906 can result in crosslinking of siloxane functional groups of the encapsulant to form an organopolysiloxane characterized by an adhesive stick, or tack. Adhesive and/or frictional characteristics of the encapsulant inhibits or restricts movement of the solar cells relative to each other and/or the solar cell string relative to the superstrate in subsequent manufacturing operations of the PV module. As such, the encapsulant may be described as adhering the solar cell string to the superstrate and/or other PV module reference point used to reference the position of the solar cells.

Referring to operation 908 of flowchart 900, the PV module manufacturing method can optionally further comprise the step of providing a second encapsulant layer over the cell string. The second encapsulant layer can be provided on a second side of the solar cells opposite from the first encapsulant layer. Referring to step 910 of FIG. 9, the PV module manufacturing method can optionally further comprise the step of placing a backsheet on the second encapsulant. Referring to operation 912 of FIG. 9, the PV module manufacturing method can further comprise the step of bonding first and second encapsulants together to encapsulate a solar cell string. For example, this can be accomplished by substantially or fully curing the first and second encapsulant layers concurrently after a backsheet is placed as depicted in the sequence of flowchart 900. In other embodiments, the first encapsulant layer can be substantially or fully cured before providing a second encapsulant layer is cured at step 908. At step 910, a backsheet can thereafter be placed on the second encapsulant layer and then the second encapsulant layer can then be substantially or fully cured and/or solidified.

In an embodiment, the superstrate, the first encapsulant, the solar cell string, the second encapsulant, and the backsheet can be cured and/or laminated in a step to form a PV laminate at step 912 of FIG. 9. In an embodiment, curing can include the process by which two interfaces (e.g., encapsulants with a superstrate and/or a backsheet) are thermally coupled and/or the process by which two materials are bonded together. At step 912, the second encapsulant layer can be cured or laminated to bond the solar cell string to the second encapsulant layer, to bond the first and second encapsulant layers together and encapsulate the solar cells, and to bond the backsheet to the second encapsulant layer. The resulting protective package, or laminate, comprising a superstrate, an encapsulated solar cell string, and a backsheet can then optionally mounted with a frame to produce a PV module.

Figure 10:
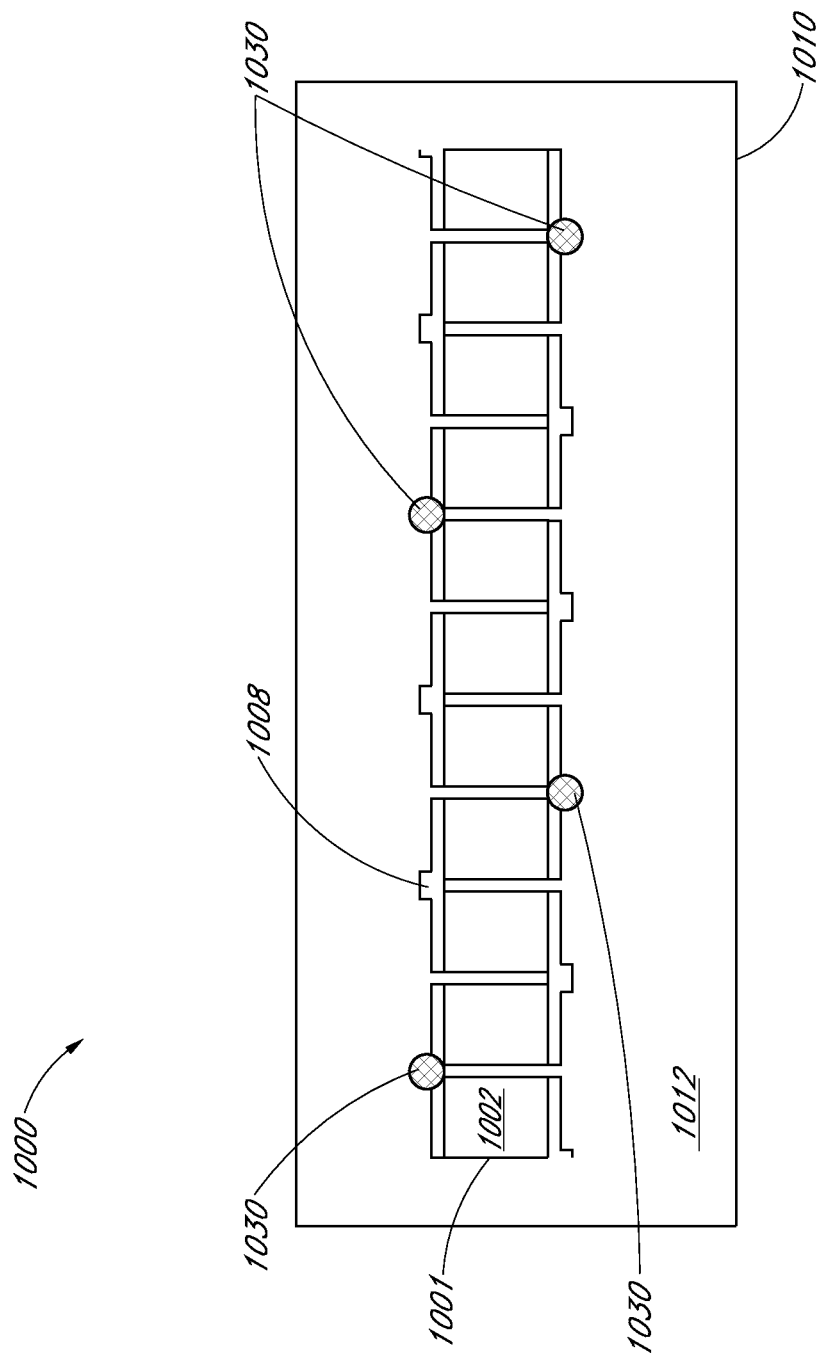
FIG. 10 illustrates a top-down view of a PV laminate during or subsequent to a contactless heating operation, according to some embodiments.

FIG. 10 depicts a top-down view of PV module subassembly 1000 comprising cell string 1001 during or subsequent to a contactless heating operation. Cell string 1001 comprises a plurality of solar cells 1002 electrically connected in series by interconnects 1008. The solar cells 1002 are in alignment such that the center point of a first solar cell and the center point of adjacent solar cell is approximately in a straight line. In the example of FIG. 10, a single solar cell string 1001 is depicted, however in other embodiments a plurality of solar cells strings can be provided with solar cells connected in any suitable series and/or parallel configuration. The solar cell string 1001 is positioned in the center of superstrate 1010 with an encapsulant layer 1012 therebetween. In the example of FIG. 10, four encapsulant bonding regions 1030 are provided at interconnects 1008 between solar cells 902 to secure the position of the solar cell string 1001 relative to the superstrate 1010. It should be appreciated, however that any other number of encapsulant regions can be provided at any suitable locations to secure the position of the solar cell string 1001 relative to the superstrate 1010.

Figure 11:
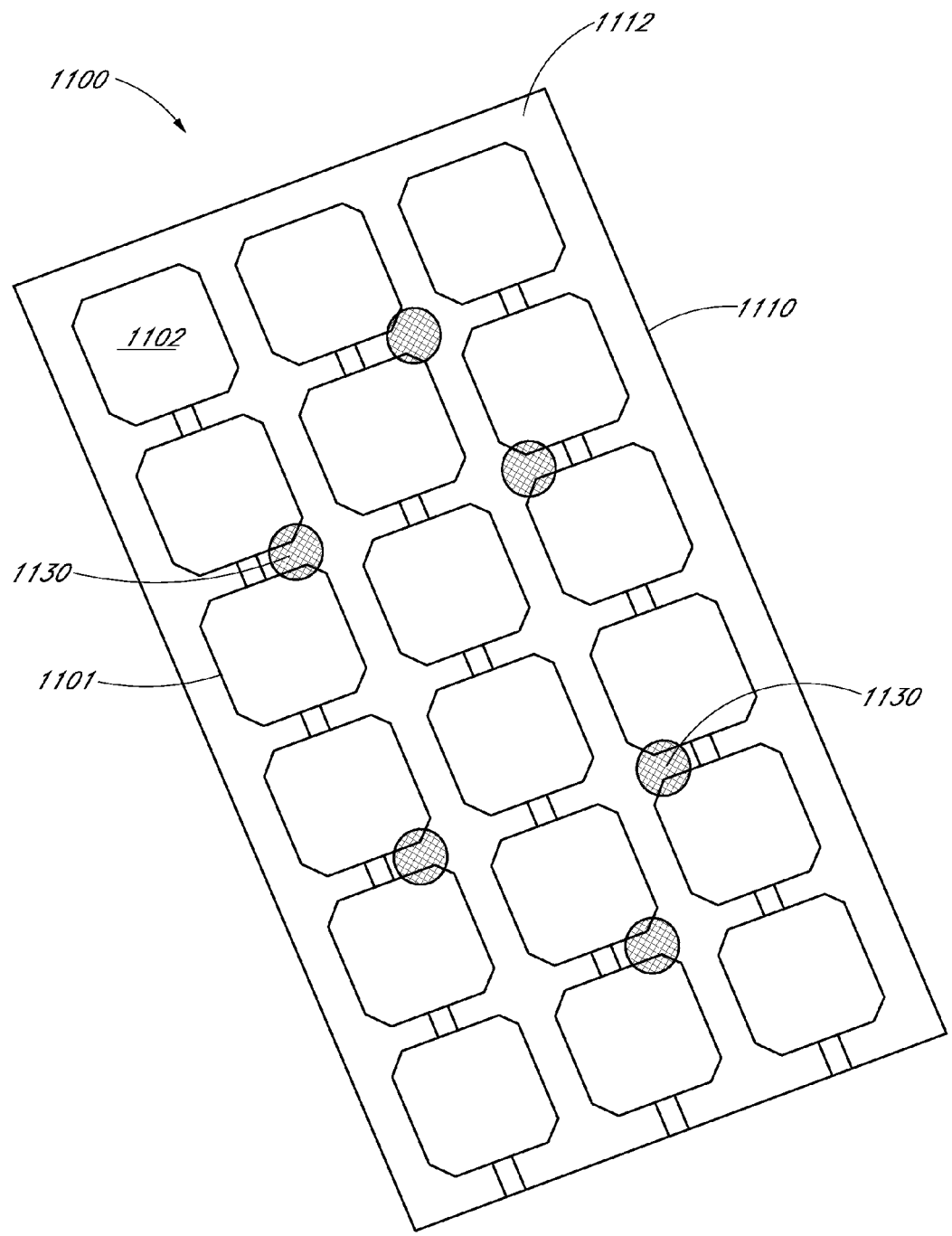
FIG. 11 illustrates a PV module subassembly during or subsequent to a contactless heating operation, according to some embodiments.

Referring to FIG. 11, a PV module subassembly 1100 is depicted at a manufacturing stage during or subsequent to a contactless heating step. The PV module subassembly 1100 comprises an encapsulant layer generally indicated at 1112 on a superstrate 1110. The PV module subassembly 1100 further comprises an array of solar cells 1102 configured into solar cell strings 1101. In the example of FIG. 11, the plurality of solar cells 1102 are positioned such that an edge of a first solar cell is linearly aligned with an edge of an adjacent solar cell. In the example of FIG. 11, eighteen solar cells 1102 are arranged into three parallel cell strings 1101, with each cell string 1101 comprising six solar cells 1102; however, any suitable number of solar cells can be provided in any desirable cell string arrangement depending on the application and design. In an embodiment, the cell strings 1101 are adhered to the superstrate 1110 by cured encapsulant bonding regions indicated at 1130. In the example of FIG. 11, six encapsulant bonding regions 1130 are depicted, however any suitable number of encapsulant bonding regions can be provided to inhibit or restrict movement of solar cell strings relative to each other and/or a superstrate in subsequent manufacturing operations.

In an embodiment, the PV module subassembly 1100 of FIG. 11 can be characterized as a partially cured PV module subassembly comprising adhesive, tacked or cured encapsulant regions 1130 within a remaining uncured, or liquid encapsulant layer 1112. During the contactless heating operation, the PV module subassembly comprises encapsulant bonding regions 1130 that are at a greater average temperature that the uncured, or liquid regions of the encapsulant layer 1112.

The above specification and examples provide a complete description of the structure and use of illustrative embodiments. Although certain embodiments have been described above with a certain degree of particularity, or with reference to one or more individual embodiments, those skilled in the art could make numerous alterations to the disclosed embodiments without departing from the scope of this invention. As such, the various illustrative embodiments of the methods and systems are not intended to be limited to the particular forms disclosed. Rather, they include all modifications and alternatives falling within the scope of the claims, and embodiments other than the one shown can include some or all of the features of the depicted embodiment. For example, elements can be omitted or combined as a unitary structure, and/or connections can be substituted. Further, where appropriate, aspects of any of the examples described above can be combined with aspects of any of the other examples described to form further examples having comparable or different properties and/or functions, and addressing the same or different problems. Similarly, it will be understood that the benefits and advantages described above can relate to one embodiment or can relate to several embodiments. For example, embodiments of the present methods and systems can be practiced and/or implemented using different structural configurations, materials, and/or control manufacturing steps. The claims are not intended to include, and should not be interpreted to include, means-plus- or step-plus-function limitations, unless such a limitation is explicitly recited in a given claim using the phrase(s) "means for" or "step for," respectively.

What is claimed is:

1. A method for manufacturing a photovoltaic (PV) module, the method comprising:
    providing a substantially transparent superstrate having a first encapsulant layer thereon;
    placing front sides of a plurality of solar cells on the first encapsulant layer, with the front sides of the solar cells facing the sun to collect solar radiation during normal operation of the PV module;
    wherein the plurality of solar cells is positioned such that an edge of a first solar cell is in alignment with an edge of an adjacent solar cell, thereby configuring the plurality of solar cells into a solar cell string;
    heating a region of the first encapsulant layer in a contactless manner to a temperature sufficient to produce at least one encapsulant bonding region, wherein heating the region of the first encapsulant layer comprises inductive heating by positioning a contactless heating head proximate to, but without physically contacting, the substantially transparent superstrate, the plurality of solar cells, and the first encapsulant layer, wherein the contactless heating head is electrically conductive and within inductive range of a magnetic field from an inductive heating circuit, wherein heating the region of the first encapsulant layer further comprises producing a magnetic field from the inductive heating circuit, and wherein the magnetic field is alternating at a frequency greater than 1 kHz and at an average power density greater than 100 mW/cm$^2$ at time intervals greater than 0.05 seconds;
    wherein the solar cell string is adhered to the superstrate by the encapsulant bonding region such that the encapsulant bonding region inhibits movement of the cell string relative to the superstrate in subsequent manufacturing operations of the PV module.

2. A method for manufacturing a PV module, the method comprising:
    providing a first encapsulant layer on a superstrate;
    placing first sides of a plurality of solar cells on the first encapsulant layer;
    heating an encapsulant bonding region within the first encapsulant layer to a temperature sufficient to adhere the plurality of solar cells to the superstrate, wherein heating the region of the first encapsulant layer comprises inductive heating by positioning an electrically conductive contactless heating head proximate to, but without physically contacting, the superstrate, the plurality of solar cells, and the first encapsulant layer and within inductive range of a magnetic field from an inductive heating circuit, wherein heating the region of the first encapsulant layer further comprises producing a magnetic field from the inductive heating circuit, and wherein the magnetic field is alternating at a frequency greater than 1 kHz and at an average power density greater than 100 mW/cm$^2$ at time intervals greater than 0.05 seconds.

3. The method of claim 2, wherein the temperature is at least 75° C.

4. The method of claim 2, wherein the encapsulant of the first encapsulant layer is a liquid.

5. The method of claim 2, wherein the encapsulant of the first encapsulant layer has a viscosity in the range of 1,000 cP to 100,000 cP.

6. The method of claim 2, wherein the encapsulant material of the first encapsulant layer is a silicone.

7. The method of claim 2, further comprising the steps of:
providing a second encapsulant layer over the plurality of solar cells, the second encapsulant layer being on a second side of the solar cells, the second side being opposite from the first side of the solar cells;
placing a backsheet on the second encapsulant layer;
curing the first and second encapsulant layers to bond the first and second encapsulants together, thereby encapsulating the plurality of solar cells;
forming a protective package comprising the superstrate, the encapsulated solar cells, and the backsheet;
mounting the protective package with a frame, the protective package comprising the plurality of solar cells encapsulated by the first and second encapsulants, the superstrate, and the backsheet, to form a PV module.

8. A method for manufacturing a photovoltaic (PV) module, the method comprising:
providing a substantially transparent superstrate having a first encapsulant layer thereon;
placing front sides of a plurality of solar cells on the first encapsulant layer, with the front sides of the solar cells facing the sun to collect solar radiation during normal operation of the PV module; and
heating a region of the first encapsulant layer in a contactless manner to a temperature sufficient to produce at least one encapsulant bonding region, wherein heating the region of the first encapsulant layer comprises inductive heating by positioning a contactless heating head proximate to, but without physically contacting, the substantially transparent superstrate, the plurality of solar cells, and the first encapsulant layer, and wherein the contactless heating head is electrically conductive and within inductive range of a magnetic field from an inductive heating circuit, wherein heating the region of the first encapsulant layer further comprises producing a magnetic field from the inductive heating circuit, and wherein the magnetic field is alternating at a frequency greater than 1 kHz and at an average power density greater than 100 mW/cm$^2$ at intervals greater than 0.05 seconds.

* * * * *